United States Patent [19]

Ashida

[11] Patent Number: 4,538,119
[45] Date of Patent: Aug. 27, 1985

[54] CLOCK EXTRACTION CIRCUIT USING AN OSCILLATOR AND PHASE-LOCKED PROGRAMMABLE DIVIDER

[75] Inventor: Akira Ashida, Yokohama, Japan

[73] Assignee: Hitachi, Ltd., Tokyo, Japan

[21] Appl. No.: 368,665

[22] Filed: Apr. 15, 1982

[30] Foreign Application Priority Data

Apr. 17, 1981 [JP] Japan .................................. 56-56949

[51] Int. Cl.³ .............................................. H03L 7/06
[52] U.S. Cl. .................................... 331/1 A; 331/18; 331/25; 328/155
[58] Field of Search ........................... 331/1 A, 18, 25; 328/63, 155; 375/110, 118, 119, 120

[56] References Cited

U.S. PATENT DOCUMENTS

| | | | |
|---|---|---|---|
| 3,983,498 | 9/1976 | Malek | 331/1 A X |
| 4,242,639 | 12/1980 | Boone | 328/155 |
| 4,280,099 | 7/1981 | Rattlingourd | 328/155 X |
| 4,363,002 | 12/1982 | Fuller | 331/1 A |

Primary Examiner—Eugene R. LaRoche
Assistant Examiner—Robert J. Pascal
Attorney, Agent, or Firm—Antonelli, Terry & Wands

[57] ABSTRACT

The present invention is a phase-locked circuit for use in digital circuits such as a high frequency clock generator, counter and memory. The circuit provides an output which is locked to the received input tone signal in both frequency and phase. The circuit includes an oscillator for generating a clock signal having a frequency higher than the frequency of an input signal; a phase information extractor for extracting phase information corresponding to the period of the input signal and forming a pulse train based on the phase information; an average period count/storage circuit for measuring an available period of input signal by counting the number of pulses of said clock signal during an interval of a predetermined number of input periods obtained by counting pulses of the pulse train based on said phase information and storing the count; a programmable counter for dividing the frequency of said clock signal in accordance with the stored count and providing an output signal; and a phase comparison/correction means for comparing said output signal with the phase information of said input signal, and producing a phase correction signal as a result of said comparison; whereby said programmable counter increases or decreases said stored count in accordance with said phase correction signal to modify the phase of said output signal.

5 Claims, 20 Drawing Figures

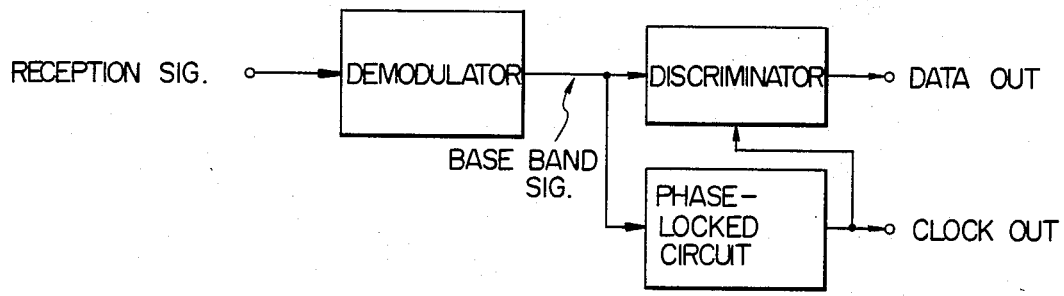
FIG. IA PRIOR ART
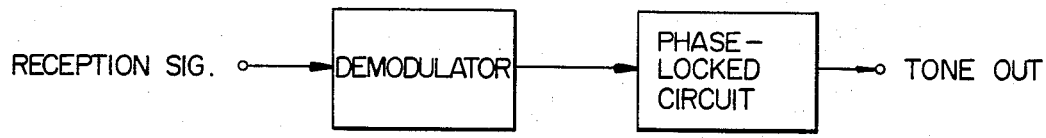
FIG. IB PRIOR ART
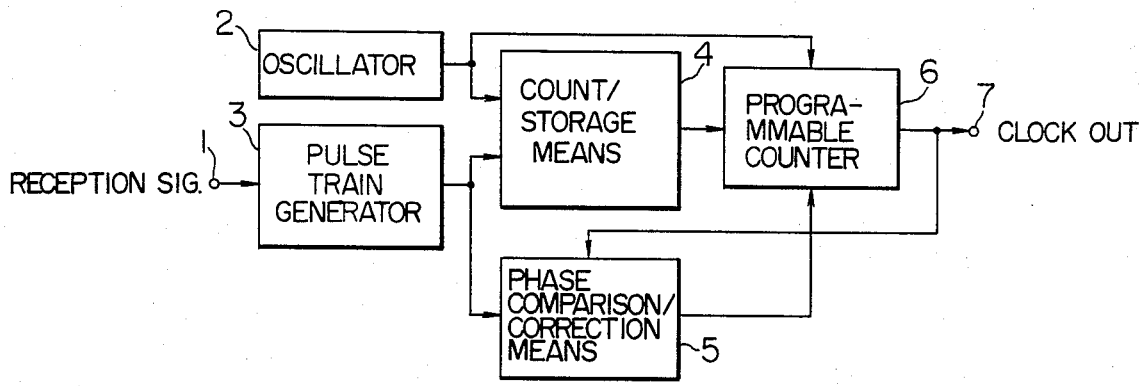
FIG. 2
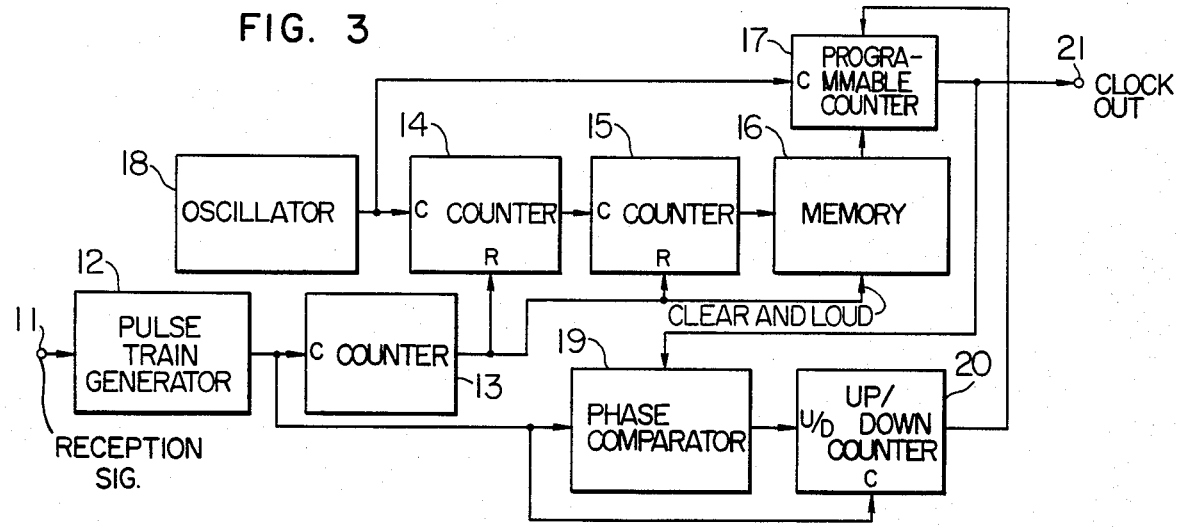
FIG. 3

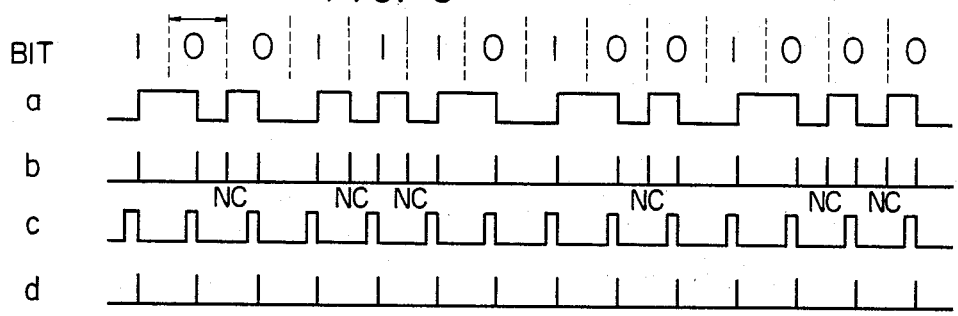
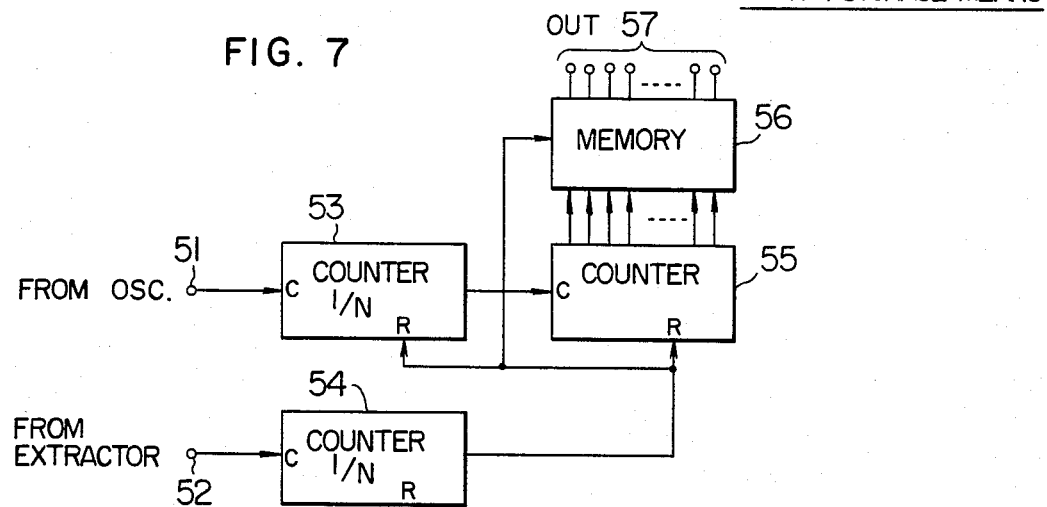
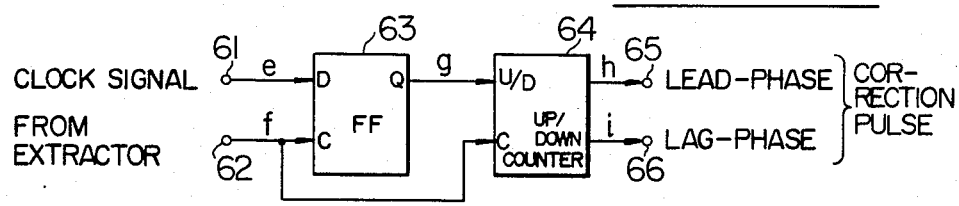
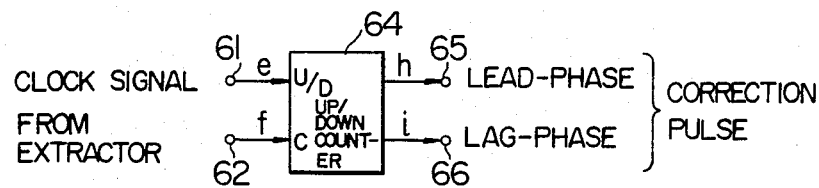

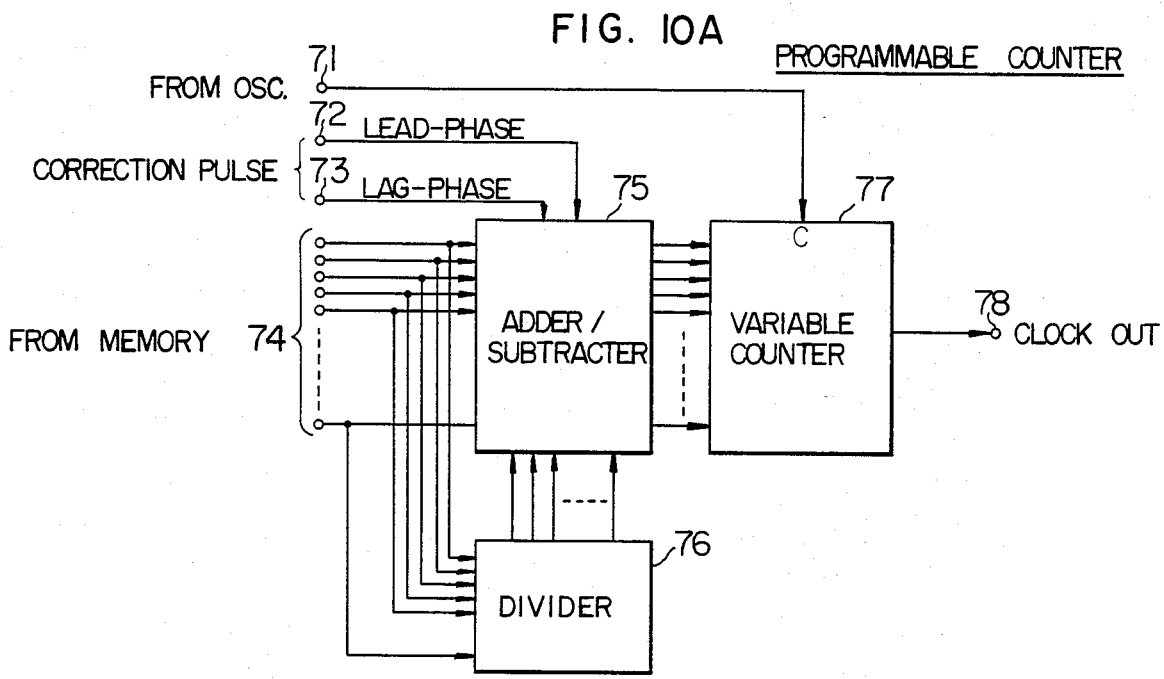
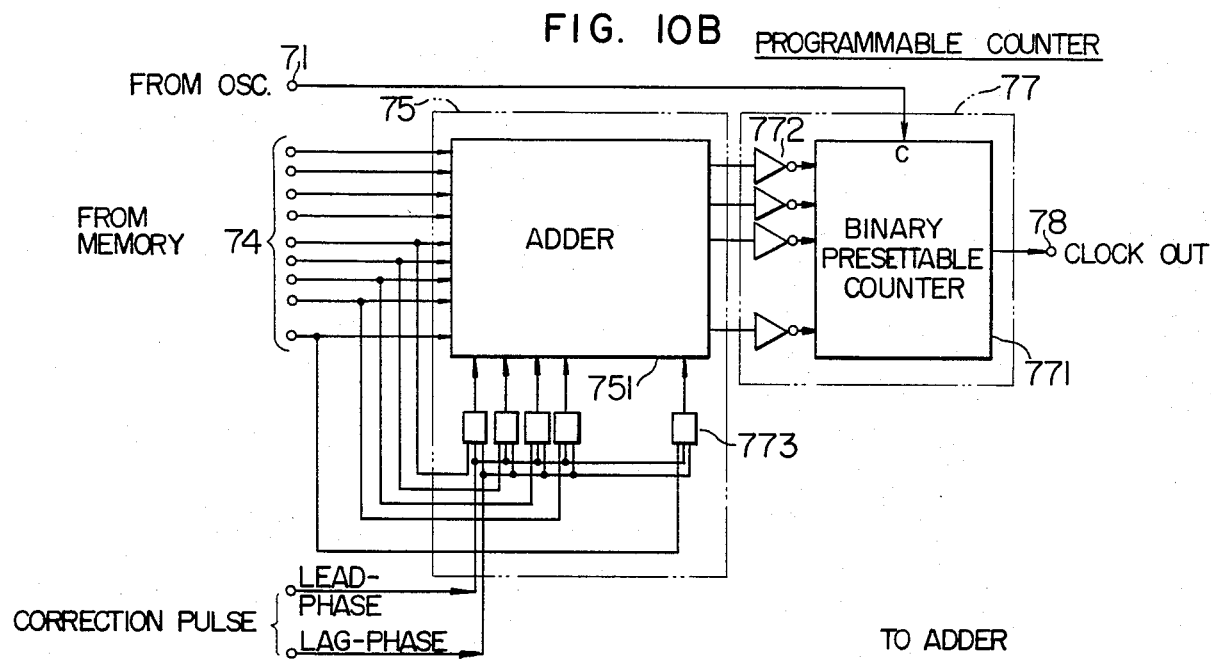
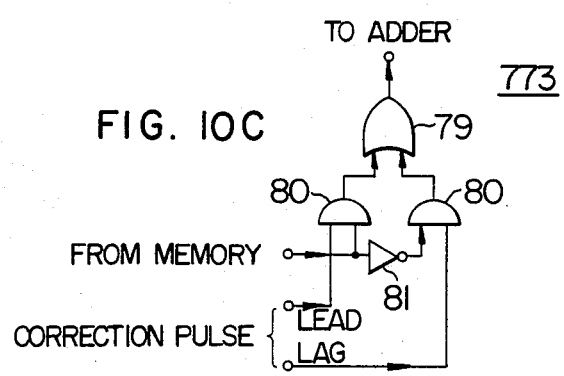

CLOCK EXTRACTION CIRCUIT USING AN OSCILLATOR AND PHASE-LOCKED PROGRAMMABLE DIVIDER

BACKGROUND OF THE INVENTION

1. Field of the Invention

The present invention relates to phase-locked circuits capable of following the varying frequency of an input signal.

1. Description of the Prior Art

Conventional phase-locked circuits are designed so that they respond to an input signal having a specific frequency, and thus are not suitable for general purpose use involving applications using different frequencies. In addition, conventional digital phase-locked circuits require an expensive high stability frequency source.

SUMMARY OF THE INVENTION

The present invention solves the above-mentioned prior art deficiencies. Accordingly, it is an object of this invention to provide a generalpurpose, inexpensive phase-locked circuit capable of following a varying frequency input signal without requiring a high stability frequency source.

According to one aspect of the present invention, there is provided a phase-locked circuit responsive to a varying frequency input signal comprising an oscillator for generating a clock signal having a frequency higher than the frequency of the input signal; a pulse train generator receiving the input signal for providing a timing signal indicating a certain phase in the input signal and forming a pulse train having pulses appearing corresponding to the timing signal; an average period count/storage circuit for measuring an average period of the input signal by counting the number of pulses of the clock signal during an interval of a predetermined number of input periods obtained by counting pulses of the pulse train and storing the count; a programmable counter for dividing the frequency of the clock signal in accordance with the stored count and providing an output signal; and a phase comparison/correction circuit for comparing the phase of the output signal with the phase of the pulses in the pulse train, and producing a phase correction signal as a result of the comparison whereby the programmable counter increases or decreases the stored count in accordance with the phase correction signal to modify the phase of the input signal.

The count/storage means comprises a first counter which counts the pulse train and provides an output pulse each time the count reaches a predetermined number, a second counter which is cleared by the output pulse of the first counter and which counts the clock signal to provide an output pulse each time the count reaches the predetermined number, a third counter which is cleared by the output pulse of the first counter and adapted to count the output pulse of the second counter, and a memory which stores the count of the third counter in response to the output pulse of the first counter and sets up the programmable counter in accordance with the stored count thereby expressing the average period of the input signal in the form of the number of pulses of the clock signal.

BRIEF DESCRIPTION OF THE DRAWINGS

FIG. 1A is a schematic block diagram of a prior art circuit for extracting the data output and clock signal from the reception input by using the phase-locked circuit.

FIG. 1B is a schematic block diagram of a prior art circuit for extracting the tone output (i.e. a frequency and a phase) from the reception input by using the phase-locked circuit.

FIG. 2 is a block diagram illustrating the basic arrangement of the phase-locked circuit of this invention.

FIG. 3 is a block diagram illustrating more particularly the phase-locked circuit of this invention.

FIG. 6 is a time chart illustrating the waveforms of various portions of the circuits shown in FIGS. 5B and 5C.

FIG. 7 is a circuit diagram of the count/storage means used in the phase-locked circuit according to the present invention.

FIGS. 8A and 8B are circuit diagrams of the phase comparing/correcting means used in the phase-locked circuit of this invention.

FIGS. 10A, 10B and 10C are circuit diagrams of the programmable counter used in the phase-locked circuit of this invention.

DESCRIPTION OF THE PREFERRED EMBODIMENT

Figure 4A:
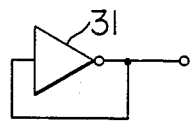
FIGS. 4A and 4B are circuit diagrams of the oscillator used in the phase-locked circuit of this invention.

The present invention generally is used with a phase-locked circuit in the receiver of the transmission systems of FIGS. 1A and 1B. The transmission system of FIG. 1A includes a reception demodulator which demodulates the radio or wire reception input if it is modulated and performs equalizing amplification of the base band transmission to provide the base band signal, a phase-locked circuit which receives the output of the demodulator and provides a clock signal, and a discriminator which outputs data by discriminating the base band signal using the clock signal. The transmission system of FIG. 1B includes a reception demodulator and a phase-locked circuit to reproduce a tone signal included in the reception input.

FIG. 2 shows the basic arrangement of the phase-locked circuit according to the present invention. The circuit includes an oscillator 2 which generates a clock signal having a frequency higher than that of an input signal supplied through an input terminal 1, a pulse train generator 3 which extracts phase information corresponding to the period of the input signal and which forms a pulse train based on the extracted information, a count/storage means 4 which measures the average period of the pulse train by counting the clock signal within a predetermined interval of the pulse train and which stores the count representing the average period of the pulse train, a programmable counter 6 which divides the frequency of the clock signal in accordance with the stored count and transmits a regenerative output, and a phase comparison/correction means 5 which compares the phase of the output of the programmable counter 6 with the phase information of the input signal and provides a phase correction signal for the programmable counter output.

A particular embodiment of the phase-locked circuit according to the present invention will now be described in connection with the block diagram shown in FIG. 3. The circuit includes an input terminal 11, a pulse train generator 12, counters 13, 14 and 15 for obtaining the average period of the input signal, a memory 16 for storing the count, a programmable counter 17, an oscillator 18, a phase comparator 19 for comparing and correcting the phase, an up/down counter 20 and an output terminal 21.

In operation, when the input signal is supplied through the input terminal 11, the pulse train generator 12 produces a differentiation pulse at the mid point of the rising edge of the signal. The interval of the differentiation pulses represents the period of the input signal. The counter 13 provides an output pulse for a predetermined number N of input pulses, thereby clearing the counters 14 and 15 and the memory 16 once every N periods of the input signal.

The oscillator 18 generates clock pulses whose frequency is much higher than that of the input signal and supplies the high frequency clock pulses to the counter 14. The counter 14 counts the input pulses and provides an output when the number of the input count reaches the number N. Like the counter 13, counter 14 supplies an output pulse to counter 15 each time the number of the input clock pulses reaches the number N. The counter 15 counts the output pulses from the counter 14. The count value is stored in the memory 16 in a binary format when the counter 13 has issued an output pulse. Accordingly, the count stored in the memory 16 is the number of clock pulses occurring during an average being taken of the input signal over N periods. That is, the average period of the input signal over N periods is counted and stored using the number of clock pulses. The value of N is determined appropriately in consideration of system requirements such as the response time for the frequency variation of the input signal.

The programmable counter 17 is given a maximum count based on the number of clock pulses stored in the memory 16 indicating the average period of the input signal as mentioned above. The programmable counter 17 counts the clock pulses from the oscillator 18 and provides an output pulse when the count reaches the maximum count set by the memory 16 to produce divided clock pulses in accordance with the set value. Accordingly, the output signal obtained at the output terminal 21 has the pulse interval which is identical to the average period of the input signal (as expressed by the number of clock pulses). The higher the clock pulse frequency relative to the input signal frequency, the smaller is the error in the output frequency.

The output of the programmable counter 17 is also supplied to the phase comparator 19 where it is compared with the phase information (differentiation pulses) from the phase information extractor 12. The result of comparison is delivered to the up/down counter 20 as the phase comparison information such as "1" for the leading phase and "0" for the lagging phase relative to the input signal.

The up/down counter 20 carries out either the up or down count depending on the phase comparison information, and provides a phase correction signal when the count reaches a certain upper or lower count corresponding to the specified range of the phase error. The phase correction signal is fed back to the programmable counter 17 so that the phase of the output pulse train is modified. This phase correction is carried out, for example, by temporarily modifying the maximum count for the programmable counter 17.

As described above, the output signal can be produced in the form of a pulse train having a frequency and phase equal to those of the input signal. The input signal does not have to have a fixed frequency and the output signal can respond to the varying frequency. In addition, even it the clock pulse frequency varies, the average period of the input signal is measured by those clock pulses and it is reproduced correctly in the output signal based on the same clock pulse frequency. Therefore, the oscillator 18 can be made using semiconductor devices without high requirements for the thermal and aging stability thus making the circuit inexpensive.

In the foregoing embodiment, the output signal is formed in a pulse train. However, it will be appreciated that the output signal can easily be transformed into a sinusoidal wave by use of a filter circuit.

The individual circuit sections constituting the foregoing phase-locked circuit will further be described in connection with each particular embodiment.

Figure 4B:
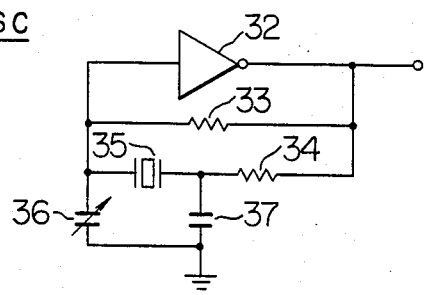

The oscillator 18 can be made in any of the well known arrangements such as those illustrated in FIGS. 4A and 4B. FIG. 4A illustrates an oscillator made up of an inverter 31. The propagation delay time of the semiconductor inverter may vary depending on the operating temperature. However, the phase-locked circuit of the present invention does not require high stability in the oscillator and thus the simple oscillator of FIG. 4a is usable. FIG. 4B illustrates a high frequencystability oscillator using a crystal vibrator 35. The oscillation frequency can be adjusted by a variable capacitor 36.

Figure 5A:
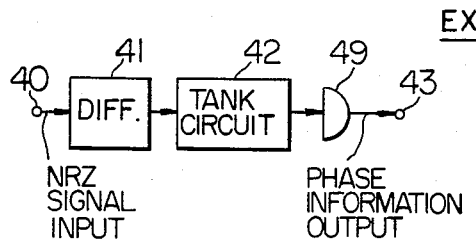
FIG. 5A is a circuit diagram of the phase information extractor used in the phase-locked circuit of this invention which is suitable when the base band signal is an NRZ (Non-Return-Zero) signal.
Figure 5B:
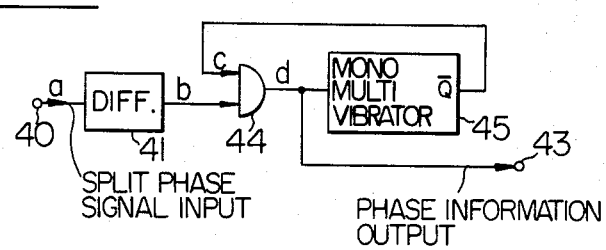
FIGS. 5B and 5C are circuit diagrams of the phase information extractor used in the phase-locked circuit of this invention which is suitable when the base band signal is a split phase signal.
Figure 5C:
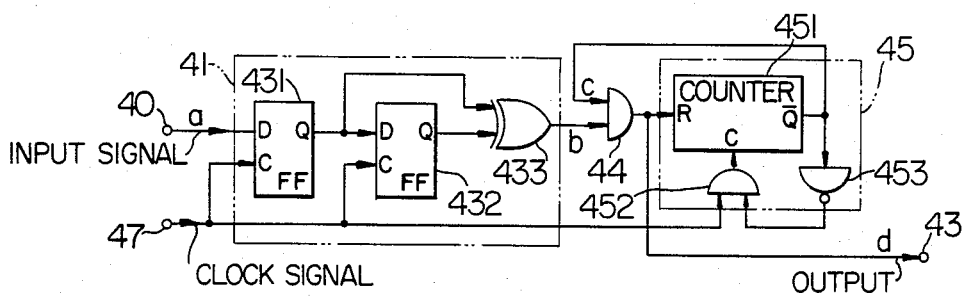

The particular circuit arrangements for the pulse train generator 12 are illustrated in FIGS. 5A to 5E. The arrangement of FIG. 5A is suitable for the case where the base band signal is a NRZ (Non-Return-to-Zero) signal applied to the terminal 40. The differentiation circuit (DIFF.) 41 generates pulses at the rising and falling edges of the input signal. Then the tank circuit 42 provides the continuous phase extraction information which is formed into pulses by the gate circuit 49 which are sent out through the terminal 43. FIG. 5B illustrates an arrangement suitable for the case where the base band signal is in the form of a split phase signal. The input signal is differentiated by the differentiation circuit 41, and resultant pulses trigger the monostable multivibrator 45 thru the gate 44. The monostable multivibrator 45 provides a false pulse at its $\bar{Q}$ terminal which is supplied to the gate 44 to form phase information at the output of the gate. FIG. 6 illustrates waveforms at various portions of the circuit, with an assumption being made that the split phase signal rises for indicating "1" and falls for indicating "0" in the middle of the bit period which as illustrated by the arrow in FIG. 6. With the pulse width of the monostable multivibrator 45 being set to t seconds, the phase-locked circuit can respond to a reception signal having a bit rate from 1/t to 1/2t. This frequency range can be extended slightly due to the characteristics of the phase-locked circuit of this invention. The monostable multivibrator 45 in FIG. 5B is an analog circuit. FIG. 5C exemplifies the fully digitalized circuit arrangement. In the latter case, the differentiation circuit 41 consists of flip-flops 431 and 432 and an exclusive OR gate 433 which provides pulses at rising and falling edges of the input signal. The terminal 47 receives the high frequency clock signal having a frequency higher than the data rate of the input signal. The output of the oscillator 2 in FIG. 2 can be used as the clock signal. The flip-flop 431 samples reception data while the flip-flop 432 delays the propagation of the signal by one clock interval. Accordingly, the width of the differentiation pulse is equal to the period of the clock supplied through the terminal 47. The monostable multivibrator 45 is made up of a counter 451, a gate 452 and an inverter 453. The differentiation pulses are fed through the gate 44 to the reset terminal R of the counter 451, causing the output of $\bar{Q}$ of the counter to become "0". This output is inverted by the inverter 453 and supplied to the gate 452. This signal enables the high frequency clock signal from the terminal 47 to go to the clock terminal C, and the counter 451 counts the high frequency clock until the count reaches the setup number. On the other hand, the "0" output from Q disables the input of the differentiation pulses at the gate 44. When the count has reached the setup number, the output Q goes "1", disabling the passage of the high frequency clock through the gate 452. Then the counter halts counting and fixes the output $\bar{Q}$ to "1". The "1" output from $\bar{Q}$ is supplied to the gate 44 so as to enable the subsequent differentiation pulse from the differentiation circuit 41. The setup number is determined in the same way as in determining the pulse width for the circuit arrangement shown in FIG. 3.

FIG. 6 shows the timing chart for the circuit arrangements of FIGS. 5B and 5C. In the chart, differentiation pulses b for the split phase signal a include unnecessary clock components (NC) which occur when the split phase signal a has the same logical state consecutively. The arrangements of FIGS. 5B and 5C eliminate the pulses NC, and differentiation pulses d are obtained.

Figure 5D:
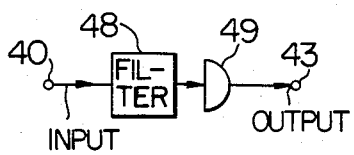
FIGS. 5D and 5E are circuit diagrams of the phase information extractor used in the phase-locked circuit of this invention which is suitable when the reception signal has a continuous frequency distribution such as in the tone signal.
Figure 5E:
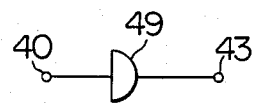

FIGS. 5D and 5E show other arrangements for the phase information extractor and they are useful when the reception signal has a continuous frequency distribution as seen in the tone signal in the general arrangement of FIG. 1B. In FIG. 5D, the input signal is fed through the filter 48 so as to eliminate noises and unnecessary components, then shaped into pulses by the gate circuit 49. FIG. 5E shows a much simplified arrangement, which is made up of a single gate 49 for shaping the input signal into pulses.

FIG. 7 shows the arrangement of the count/storage means 4 in FIG. 2 for obtaining the average period of the input signal. The frequency reduction factor N by the counters 53 and 54 corresponds to the number of samples for obtaining the average period of the reception signal, and it is determined to meet the requirement of the transmission system and also in consideration of the characteristics of the phase-locked circuit according to this invention. The capacity of the counter 55 and memory 56 is chosen so as to cover the operation range determined from the data rate of the transmission system and the output frequency of the oscillator 2 in FIG. 2. If a binary counter is used for the counter 55, it may have the same capacity as that of the memory 56.

Figure 9:
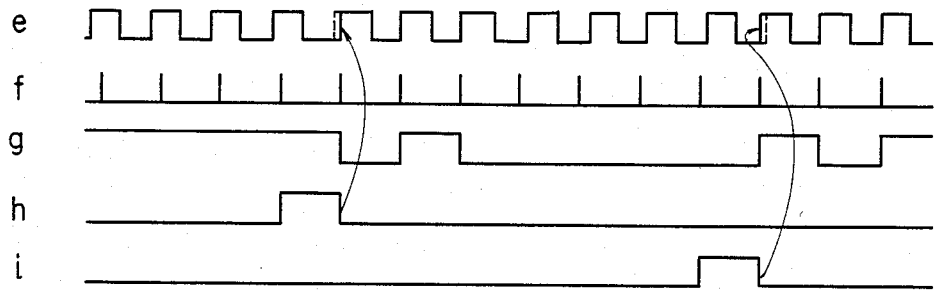
FIG. 9 is a time chart illustrating the waveforms of various portions of the circuits of FIGS. 8A and 8B.

FIGS. 8A and 8B illustrates examples of the phase comparison/correction means of FIG. 2. The arrangement of FIG. 8A includes a flip-flop 63 and an up-down counter 64 while the arrangement of FIG. 8B has only an up/down counter 64. FIG. 9 is a timing chart illustrating the waveforms of various portions of the circuits shown in FIGS. 8A and 8B. In FIG. 8A, the clock signal is applied to terminal D of the flip-flop 63 and the output of the phase information extractor is applied to terminal C. Accordingly, the flip-flop 63 provides at terminal Q an output "1" when the phase information signal f precedes the clock signal e, and provides an output "0" when the signal f follows the signal e. Since the clock signal e has a duty cycle of about 50%, the logical state of the terminal Q indicates the phase lead or lag of the input signal. The up/down counter 64 is preset to a value of N which relates the loop gain of the phase-locked circuit that is determined from the transmission system design. In this embodiment the counter 64 is set to "4". A larger value N results in a smaller loop gain. As can be seen from the timing chart of FIG. 9, when the phase information signal has a leading phase compared with the rise of the clock signal e, a lead phase correction pulse h is produced for every four lead phases. When the phase information signal has a lagging phase compared with the rise of the clock signal e, a lag phase correction pulse i is produced for every four lag phases. In the programmable counter, these correction pulses are used to modify the position of the phase of the signal e from the dotted line to the solid line in FIG. 9.

The phase-locked circuit of the present invention performs frequency locking and phase locking simultaneously. If the frequency is not locked properly, the operation of the phase comparison/correction means cannot be said to be significant. The circuit operates as the normal phase-locked circuit when the frequency is almost locked. The following description is based on the assumption that the frequency is almost properly locked.

The programmable counter provides the output having the same frequency and phase as those of the reception signal. FIG. 10A illustrates an example of the programmable counter, which consists of an adder/subtractor 75, a divider 76 and a variable counter 77. Terminals 74 receive the outputs of the memory. In the frequency locking operation, the average period information determines the count value of the variable counter 77, which counts the constant frequency clock from the oscillator and provides the clock signal output. In the phase-locking operation, the adder/subtractor 75 adds a predetermined value to the memory output when a lead phase pulse is applied or subtracts the value from the memory output when a lag phase pulse is applied. As can be seen from the timing chart of FIG. 9, the variable counter 77 operates once with a different count value than the memory output during one bit interval of the reception data (one period in case of a tone signal). Accordingly, the amount of phase modification is determined by the divisor of the divider 76. For example, with the divisor being of 100, the phase is modified at a rate of 1/100 of one bit interval (i.e. about 0.06 radian). Accordingly, the optimum amount of phase modification for the system design can easily be set by the divisor of the divider 76.

FIG. 10B shows an example of the programmable counter handling binary numbers, where the adder/subtractor 75 consists of an adder 751 and addend/subtrahend converters 773. As illustrated in FIG. 10C, each converter 773 consists of an OR gate 79, AND gates 80 and an inverter 81. When the converter 773 receives a lead-phase correction pulse, it transmits the memory output directly to the adder 751, or supplies the inverted memory output to the adder when it receives a lag-phase correction signal. Since data is formatted in binary, subtraction is carried out by two's compliment addition. The arrangement of FIG. 10B does not need a divider like the divider 76 in FIG. 10A, since shifting the output of the memory by K bits lower signifies a dividing operation by $2^k$. The phase correction is carried out during one bit interval when a lead-phase correction pulse or lag-phase correction pulse occurs as described in connection with FIG. 10A. The variable counter 77 consists of inverters 772 and a binary preset counter 771. The preset counter 771 is preset through the inverters 772 and counts the high frequency clock from the oscillator starting from the preset value until overflow occurs. The adder 751 provides the binary output represented by the number of high frequency clock pulses. The number indicates either the average period of the reception input or the period of the input at the time of phase correction. As mentioned previously, when the output of the adder 751 is inverted, the maximum count value subtracted by the above-mentioned process is preset to the counter 771. It counts the number of high frequency clock pulses, provided by the adder 751, until overflow occurs.

Figure 11:
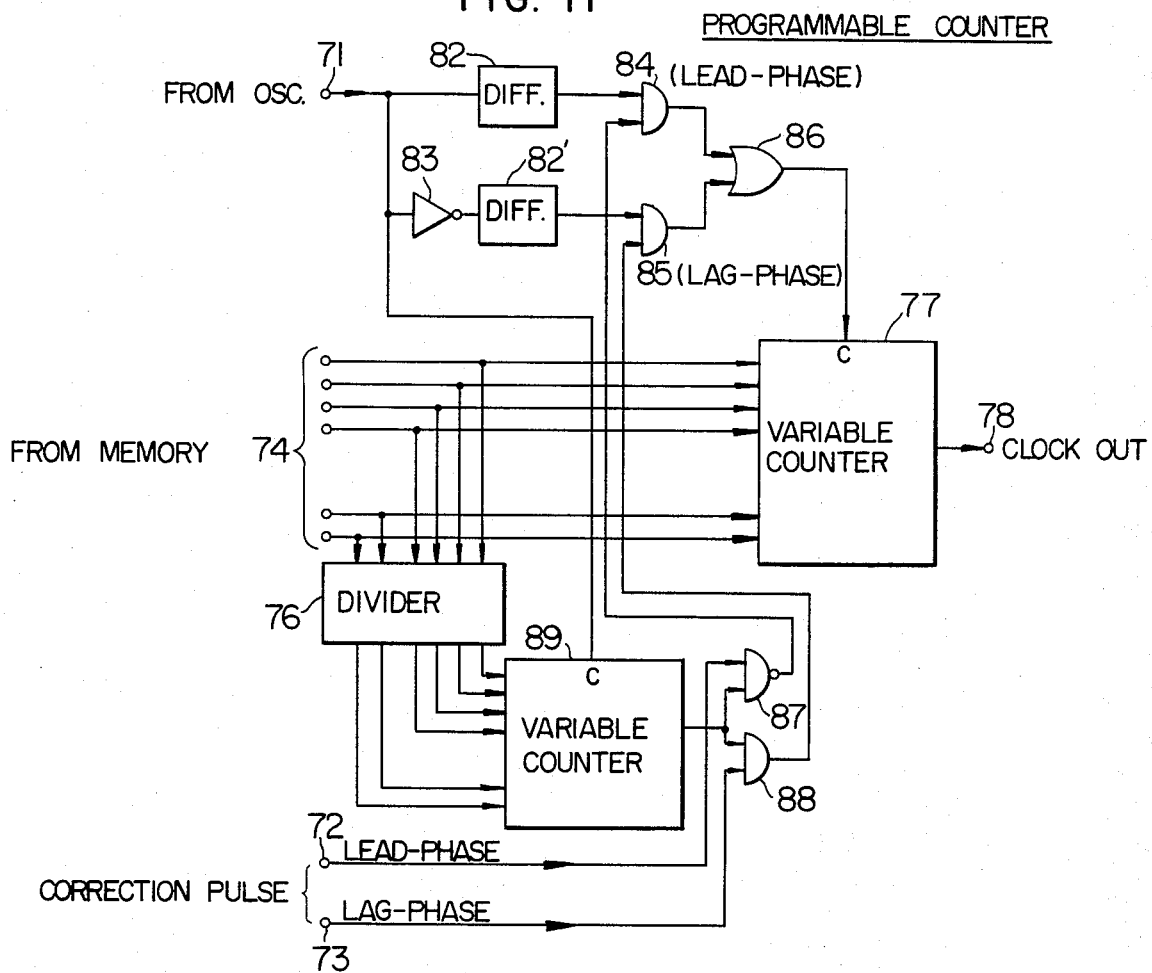
FIG. 11 is a circuit diagram of the programmable counter used in the phase-locked circuit of this invention.

FIG. 11 shows still another embodiment of the programmable counter in FIG. 10A and 10B, in which a number of high frequency clock pulses are applied to or removed from the counter. The amount of phase modification is determined by the divider 76 as in FIG. 10A. The variable counter 89 provides a pulse output having a pulse width indicating the amount of phase modification determined by the output of the divider 76. The differentiation circuit 82 performs the differentiation only at the rising edge of the input pulse. To make a lead-phase for the clock signal output, the gate 87 provides a negative pulse having a pulse width proportional to the amount of phase modification and applies it to the gate 84 when the gate 87 receives a phase correction pulse. Then high frequency clock signals differentiated by the circuit 82 are counted, resulting in a lead-phase in the clock signal output by the amount of phase modification. Conversely, when a lag-phase correction pulse is applied, the gate 88 provides a positive pulse having a pulse width representing the amount of phase modification and applies it to the gate 85. The differentiated clock signals provided through the inverter 83 and differentiation circuit 82' are out of phase by 180°. The output signal of the gate 85 is applied to the gate 86 during the period of the positive pulse together with 0° (phase differentiated) pulses derived from the high frequency clock signal supplied through the gate 84. That is, as 180° (phase differentiated) pulses are inserted, the phase of the clock signal output is delayed by the amount of phase modification.

With data formatted in binary and with the divisor given as $2^k$, the divider 76 can be omitted as in the case of the arrangement shown in FIG. 10B.

As described above in detail, the present invention provides a phase-locked circuit which follows the input signal having an arbitrary frequency. The circuit does not need a high stability oscillator, allowing the full semiconductor design and fabrication in an integrated circuit. The present invention is significantly effective for realizing a versatile, compact and inexpensive digital phase-locked circuit.

We claim:

1. A phase-locked circuit capable of following a varying frequency input signal comprising:
    an oscillator for generating a clock signal having a frequency higher than the frequency of the input signal;
    a pulse train generator receiving the input signal for providing a timing signal indicating a certain phase in the input signal and forming a pulse train having pulses appearing corresponding to the timing signal;
    average period count/storage means for measuring an average period of the input signal by counting the number of pulses of said clock signal during an interval of a predetermined number of input periods obtained by counting pulses of the pulse train and storing the count;
    a programmable counter for dividing the frequency of said clock signal in accordance with the stored count and providing an output signal; and
    phase comparison/correction means for comparing the phase of said output signal with the phase of pulses in said pulse train, and producing a phase correction signal as a result of said comparison; whereby said programmable counter increases or decreases said stored count in accordance with said phase correction signal to modify the phase of said output signal.

2. A phase-locked circuit in accordance with claim 1 wherein said programmable counter includes dividing means for dividing the count from said average period count/storage means by a predetermined number, an adder/subtracter coupled to said average period count/storage means and said dividing means for adding/subtracting the output of said average period count/storage means to/from the output of said dividing means and a variable counter having stored therein a count of said added/subtracted output from said adder/subtracter for counting said clock signal up to said added/subtracted output to provide said output signal.

3. A phase-locked circuit in accordance with claim 1 wherein said programmable counter includes dividing means for dividing the count from said average period count/storage means by a predetermined number, first means connected with said oscillator and said dividing means for providing a pulse signal having a duration corresponding to the product of the period of said clock signal with the output value of said dividing means, second means connected with said first means and responsive to said phase correction signal for increasing/decreasing a number of clock pulses of said clock signal during the time duration of said pulse signal from said first means, and a variable counter connected with said average period count/storage means for counting the output of said second means up to the count of said average period count/storage means to provide said output signal.

4. A phase-locked circuit according to claim 1 or 2, wherein said average period count/storage means comprises:
    a first counter for counting pulses of said pulse train of the input signal and providing an output pulse each time the count reaches a predetermined number;
    a second counter being cleared by said output pulse, counting pulses of said clock signal and providing an output pulse each time the count reaches said predetermined number;

a third counter being cleared by the output pulse of said first counter, and counting output pulses of said second counter; and a memory storing the count of said third counter in response to the output pulse of said first counter and, at the same time, setting the count of said programmable counter in accordance with the count of said third counter.

5. A phase-locked circuit according to claim 1 or 2, wherein said phase comparison/correction means comprises:

a phase comparator for comparing the phase of the output signal from said programmable counter with the phase of said pulse train for the input signal and providing a phase leading or phase lagging indicating signal as a result of said comparison, and an up/down counter for counting up or down in accordance with said indicating signal and providing a phase correction signal to said programmable counter when the count of said up/down counter reaches an upper or lower predetermined count value.

* * * * *